(12) United States Patent
Ye (10) Patent No.: US 10,359,873 B2
(45) Date of Patent: Jul. 23, 2019

(54) TOUCH DISPLAY SCREEN

(71) Applicant: Wuhan China Star Optoelectronics Technology Co., Ltd., Wuhan, Hubei (CN)

(72) Inventor: Jian Ye, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 112 days.

(21) Appl. No.: 15/526,321

(22) PCT Filed: Mar. 10, 2017

(86) PCT No.: PCT/CN2017/076356
§ 371 (c)(1),
(2) Date: May 11, 2017

(87) PCT Pub. No.: WO2018/152876
PCT Pub. Date: Aug. 30, 2018

(65) Prior Publication Data
US 2018/0356921 A1    Dec. 13, 2018

(30) Foreign Application Priority Data

Feb. 22, 2017  (CN) .......................... 2017 1 0097315

(51) Int. Cl.
*G06F 3/041* (2006.01)
*G02F 1/1333* (2006.01)
(Continued)

(52) U.S. Cl.
CPC .......... *G06F 3/0412* (2013.01); *G02F 1/1368* (2013.01); *G02F 1/13306* (2013.01);
(Continued)

(58) Field of Classification Search
CPC . G02F 1/13338; G02F 1/13452; G06F 3/0412
See application file for complete search history.

(56) References Cited

U.S. PATENT DOCUMENTS

| 2002/0186208 A1 | 12/2002 | Feldman et al. | |
| 2011/0141042 A1* | 6/2011 | Kim ..................... | G02F 1/13338 345/173 |
| 2014/0043546 A1* | 2/2014 | Yamazaki .......... | G02F 1/13338 349/12 |

FOREIGN PATENT DOCUMENTS

| CN | 203606592 U | 5/2014 |
| CN | 104731414 A | 6/2015 |

(Continued)

*Primary Examiner* — Shaheda A Abdin
(74) *Attorney, Agent, or Firm* — Andrew C. Cheng (57) ABSTRACT

An embodiment of the present disclosure discloses a touch display screen including: a display unit including: an upper substrate; a lower substrate located below the upper substrate and opposed to the upper substrate, the lower substrate is arranged with a plurality of thin film transistors, a driving circuit and a printed circuit board, a plurality of the thin film transistors is electrically connected to the driving circuit, the driving circuit is electrically connected to the printed circuit board; a touch unit including: a first touch electrode is electrically connected to the printed circuit board through a first lead; a second touch electrode electrically insulated from the first touch electrode, the second touch electrode is electrically connected to the printed circuit board through a second lead. The present disclosure has the advantage of reducing the cost.

19 Claims, 3 Drawing Sheets

(51) Int. Cl.
*G02F 1/1368* (2006.01)
*G02F 1/133* (2006.01)
*G02F 1/1343* (2006.01)
*H01L 27/32* (2006.01)
*H01L 51/52* (2006.01)
*G02F 1/1335* (2006.01)

(52) U.S. Cl.
CPC ...... *G02F 1/13338* (2013.01); *G02F 1/13439* (2013.01); *G02F 1/134309* (2013.01); *H01L 27/323* (2013.01); *H01L 27/3276* (2013.01); *H01L 51/5253* (2013.01); *G02F 1/133514* (2013.01)

(56) References Cited

FOREIGN PATENT DOCUMENTS

| | | |
|---|---|---|
| CN | 105278748 A | 1/2016 |
| CN | 105717682 A | 6/2016 |
| CN | 205944094 U | 2/2017 |

\* cited by examiner

TOUCH DISPLAY SCREEN

CROSS REFERENCE

The present disclosure claims the priority of No. 201710097315.6, entitled "touch display screen", filed on Feb. 22, 2017, the disclosure of which is incorporated herein by reference in its entirety.

FIELD OF THE DISCLOSURE

The present disclosure relates to a display technology field, and more particularly to a touch display screen.

BACKGROUND OF THE DISCLOSURE

In recent years, with the development of electronic technology, touch display devices such as smart phones, tablet PCs in people's daily life more and more widely, moreover, the current touch display device functions more and more, to provide users with more convenience.

The conventional touch display device includes a touch display screen including a lower display unit and an upper touch unit, such as an OLED panel or an LCD panel, the display unit includes a thin film transistor, a driving circuit and a first printed circuit board, the thin film transistor is electrically connected to the driving circuit, the driving circuit is electrically connected to the first printed circuit board. The touch unit is located above the display unit, the touch unit includes a first touch electrode and a second touch electrode, the first touch electrode and the second touch electrode are electrically insulated, for example, an insulating layer is provided between the first touch electrode and the second touch electrode, the touch unit also includes a second printed circuit board, the first touch electrode and the second touch electrode are electrically connected to the second printed circuit board through a lead wire, respectively, the first printed circuit board and the second printed circuit board are located on different layers of the touch screen, thereby increasing the number of parts, the process is also more complicated and the cost is higher.

SUMMARY OF THE DISCLOSURE

A technical problem to be solved in the embodiment of the present disclosure is to provide a touch screen. Can be used to reduce costs.

In order to solve the above technical problems, an embodiment of the present disclosure provides a touch display screen including:

a display unit including:
an upper substrate;
a lower substrate located below the upper substrate and opposed to the upper substrate, the lower substrate is arranged with a plurality of thin film transistors, a driving circuit and a printed circuit board, a plurality of the thin film transistors is electrically connected to the driving circuit, the driving circuit is electrically connected to the printed circuit board;
a touch unit located on the upper substrate, including:
a first touch electrode located on the upper substrate, the first touch electrode is electrically connected to the printed circuit board through a first lead;
a second touch electrode electrically insulated from the first touch electrode, the second touch electrode is electrically connected to the printed circuit board through a second lead; wherein, the first lead is electrically connected to the printed circuit board across a distance between the printed circuit board and the first touch electrode, the second lead is electrically connected to the printed circuit board across a distance between the printed circuit board and the second touch electrode.

Wherein, the first lead includes a first transverse section, a first oblique section and a second transverse section, one end of the first transverse section is electrically connected to the first touch electrode, the other end of the first transverse section is electrically connected to the first oblique section, the first oblique section is electrically connected to the second transverse section across a distance between the printed circuit board and the first touch electrode, the second transverse section is electrically connected to the printed circuit board at the end away from the first oblique section.

Wherein, the second lead includes a third transverse section, a second oblique section and a fourth transverse section, one end of the third transverse section is electrically connected to the second touch electrode, the other end of the third transverse section is electrically connected to the second oblique section, the second oblique section is electrically connected to the fourth transverse section across a distance between the printed circuit board and the second touch electrode, the fourth transverse section is electrically connected to the printed circuit board at the end away from the second oblique section.

Wherein, the first lead includes a fifth transverse section, a third oblique section, a sixth transverse section, a fourth oblique section and a seventh transverse section, one end of the fifth transverse section is electrically connected to the first touch electrode, the other end of the fifth transverse section is electrically connected to the third oblique section, the third oblique section is electrically connected to the sixth transverse section across a distance between the first touch electrode and the second touch electrode, the sixth transverse section is electrically connected to the fourth oblique section at the end away from the third oblique section, the fourth oblique section is electrically connected to the seventh transverse section across a distance between the printed circuit board and the first touch electrode, the seventh transverse section is electrically connected to the printed circuit board at the end away from the fourth oblique section.

Wherein, the second lead includes an eighth transverse section, a fifth oblique section, a ninth transverse section, a sixth oblique section and a tenth transverse section, one end of the eighth transverse section is electrically connected to the second touch electrode, the other end of the eighth transverse section is electrically connected to the fifth oblique section, the fifth oblique section is electrically connected to the ninth transverse section across the thickness of the second touch electrode, the ninth transverse section is electrically connected to the sixth oblique section at the end away from the fifth oblique section, the sixth oblique section is electrically connected to the tenth transverse section across a distance between the printed circuit board and the first touch electrode, the tenth transverse section is electrically connected to the printed circuit board at the end away from the sixth oblique section.

Wherein, the first touch electrode and the second touch electrode are made of a flexible conductive material resistant to winding, the first touch electrode is integrally formed with the first lead, and the second touch electrode is integrally molded with the second lead.

Wherein, the first touch electrode and the second touch electrode are made of indium tin oxide, the first lead is electrically connected to the first touch electrode, and the second lead is electrically connected to the second touch electrode.

Wherein, the display unit further includes an organic light emitting unit located between the upper substrate and the lower substrate, the upper substrate is a thin film encapsulation layer.

Wherein, a liquid crystal layer is provided between the upper substrate and the lower substrate, and the upper substrate is arranged with a color filter facing away from surface of the touch unit.

Wherein, the printed circuit board is a flexible printed circuit board.

The embodiment of the present disclosure has the following advantageous effects:

since the thin film transistor is electrically connected to the driving circuit, the driving circuit is electrically connected to the printed circuit board, the first touch electrode is connected to the printed circuit board through the first lead wire, the second touch electrode is connected to the printed circuit board through the second lead, thus, there is no need for two printed circuit boards due to the thin film transistor, the first touch electrode, and the second touch electrode, so that the cost can be saved, and the process is relatively simple with respect to the prior art.

BRIEF DESCRIPTION OF THE DRAWINGS

In order to more clearly illustrate the embodiments of the present disclosure or the technical solutions in the prior art, the following drawings, which are to be used in the description of the embodiments or the prior art, will be briefly described below, it will be apparent that the drawings in the following description are merely exemplary of the disclosure and that other drawings may be obtained by those skilled in the art without departing from the inventive work.

DETAILED DESCRIPTION OF PREFERRED EMBODIMENTS

The embodiments described in the embodiments of the present disclosure will now be described in conjunction with the accompanying drawings in the embodiments of the present disclosure, and it will be apparent that the described embodiments are merely part of the embodiments of the disclosure and are not intended to be exhaustive. All other embodiments obtained by those of ordinary skill in the art without making creative work are within the scope of the present disclosure, based on embodiments in the present disclosure.

The terms "including" and "having" and any variations thereof appearing in the specification, claims, and drawings of the present application are intended to cover non-exclusive inclusion. Such as a process, method, system, product, or device that includes a series of steps or units, are not limited to the steps or units listed, but optionally also includes steps or units that are not listed, or optionally other steps or units inherent to such processes, methods, products, or devices. In addition, the terms "first", "second" and "third" are used to distinguish different objects, and are not intended to describe a particular order.

The First Embodiment

Figure 1:
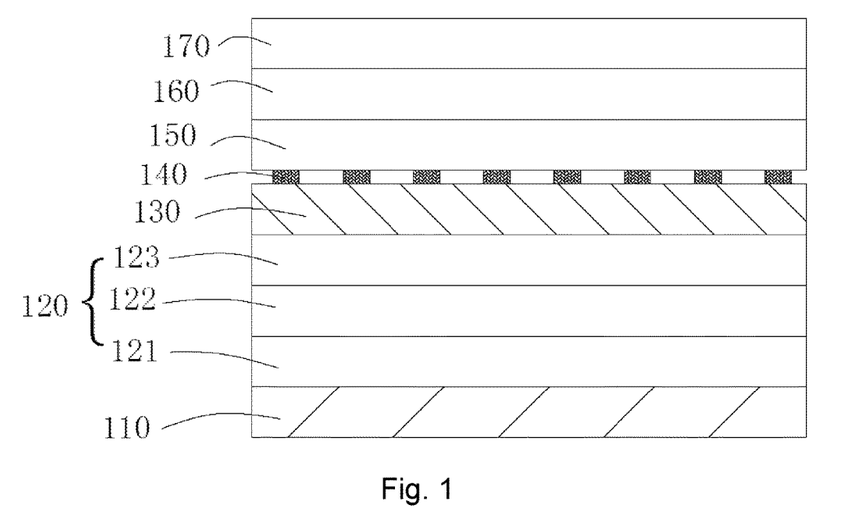
FIG. 1 is a cross-sectional view of the touch display screen of the first embodiment of the present disclosure.
Figure 2:
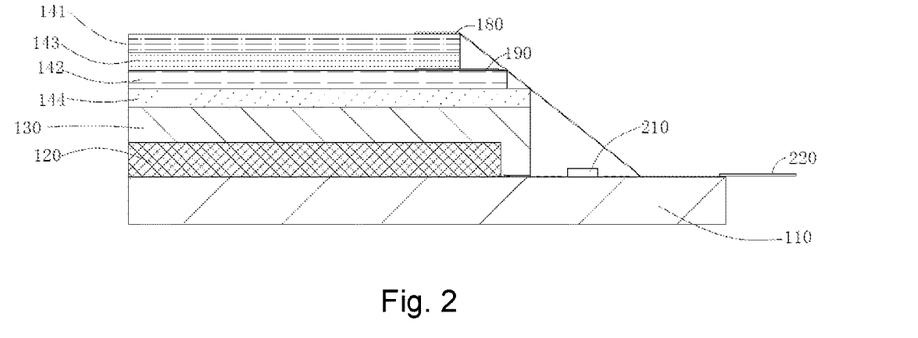
FIG. 2 is a cross-sectional view of the display unit and the touch unit according to the first embodiment of the present disclosure.
Figure 3:
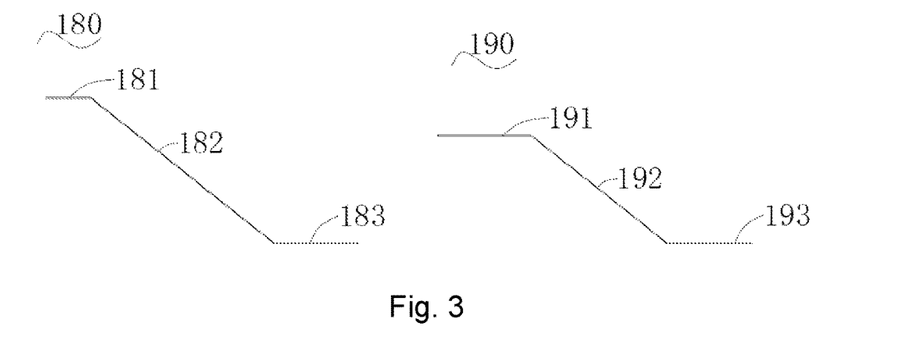
FIG. 3 is a cross-sectional view of the first lead and the second lead of the first embodiment of the present disclosure.

Please refer to FIG. 1 to FIG. 3, the touch display screen includes a display unit and a touch unit 140, the display unit may be a liquid crystal display unit (LCD) or an OLED (Organic Light Emitting Diode) or other display unit. For convenience of description, the display unit may be described by OLED as an example, the touch unit 140 is located above the display unit.

Specifically, in the present embodiment, the display unit includes an upper substrate 130 and a lower substrate 110, the upper substrate 130 is a thin film encapsulation layer, the lower substrate 110 is located below the upper substrate 130 and is opposed to the upper substrate 130, the lower substrate 110 is provided with a gate line extending in the row direction, a source line extending in the column direction, a plurality of thin film transistors, a driving circuit 210, and a printed circuit board 220, the gate line and the source line are arranged alternately, the thin film transistor is arranged at the intersection of the gate line and the source line, the control terminal of the thin film transistor is connected with the gate line, the input terminal of the thin film transistor is connected with the source line, and the output terminal of the thin film transistor is connected with the cathode 123 or the anode 121 of the OLED. The plurality of thin film transistors is electrically connected to the driving circuit 210 through the gate line and the source line, and the driving circuit 210 is electrically connected the printed circuit board 220, in the present embodiment, the driving circuit 210 and the printed circuit are located outside the display area of the display unit. In the present embodiment, the printed circuit board 220 is disposed close to the lower substrate 110, and the printed circuit board 220 is a flexible printed circuit board 220, and the flexible printed circuit board 220 can be folded. In other embodiments of the present disclosure, the printed circuit board and the lower substrate may also be spaced apart from other layers, such as an insulating layer, the printed circuit board may, for example, be in close contact with the upper substrate on the surface of the lower substrate.

The touch unit 140 is located on the upper substrate 130, and the touch unit 140 includes a first touch electrode 141 and a second touch electrode 142, the first touch electrode 141 is located on the upper substrate 130. The first touch electrode 141 is electrically connected to the printed circuit board 220 through a first lead 180, the second touch electrode 142 is electrically insulated with the first touch electrode 141, the second touch electrode 142 is electrically insulated from the first touch electrode 141, in the present embodiment, an intermediate insulating layer 143 is provided between the first touch electrode 141 and the second touch electrode 142, the intermediate insulating layer 143 is used to effect electrical insulation between the first touch electrode 141 and the second touch electrode 142, and the second touch electrode 142 is electrically connected to the printed circuit board 220 through the second lead wire 190. In addition, in other embodiments of the present disclosure, the first and second touch electrodes may also be located on the same layer, and the first and second touch electrodes are electrically insulated at an intersecting position through an insulating layer.

In order to realize that the first touch electrode 141 is electrically connected to the printed circuit board 220 through the first lead 180, the second touch electrode 142 is electrically connected to the printed circuit board 220 through the second lead 190, in the present embodiment, the first lead 180 is electrically connected to the printed circuit board 220 across the space between the printed circuit board 220 and the first touch electrode 141, specifically, one end of the first lead 180 is electrically connected to the first touch electrode 141, and the other end of the first lead 180 is electrically connected to the printed circuit board 220, in particular the first lead 180 is electrically connected to a pin or circuit on the printed circuit board 220; the second lead 190 crossing the distance between the printed circuit board 220 and the second touch electrode 142 to be electrically connected to the printed circuit board 220, specifically, one end of the second lead 190 is electrically connected to the second touch electrode 142, and the other end of the second lead 190 is electrically connected to the printed circuit board 220, specifically the second lead 190 is electrically connected to a pin or circuit on the printed circuit board 220.

Since the thin film transistor is electrically connected to the driving circuit 210, the driving circuit 210 is electrically connected to the printed circuit board 220, and the first touch electrode 141 is connected to the printed circuit board 220 through the first lead 180, The second touch electrode 142 is connected to the printed circuit board 220 through the second lead 190, thus, relative to the prior art, it is not necessary to provide two printed circuit boards 220 due to the thin film transistor, the first touch electrode 141, and the second touch electrode 142, so that the cost can be saved, and the process is also relatively simple with respect to the prior art.

Please refer to FIG. 2 and FIG. 3, in the present embodiment, the first lead 180 includes a first transverse section 181, a first oblique section 182 and a second transverse section 183, one end of the first transverse section 181 is electrically connected to the first touch electrode 141, the other end of the first transverse section 181 is electrically connected to the first oblique section 182, the first transverse section 181 may be integrally molded or separately formed with the first touch electrode 141, the first transverse section 181 extends laterally from the end of the first touch electrode 141 in the direction of the first oblique section 182. The first oblique section 182 is electrically connected to the second transverse section 183 across a distance between the printed circuit board 220 and the first touch electrode 141, in particular, the first oblique section 182 spans the spacing between the upper substrate 130 and the first touch electrode 141, the spacing between the upper substrate 130 and the printed circuit board 220, the first oblique section 182 is provided obliquely, the inclination angle of the first oblique section 182 is 10° to 75°, for example, 10°, 20°, 30°, 40°, 45°, 50°, 60°, 70°, 75°, in FIG. 3, the first oblique section 182 extends obliquely from the upper left corner to the lower right corner, and the first oblique section 182 may be integrally molded or separately formed with the first transverse section 181. The second transverse section 183 is electrically connected to the printed circuit board 220 from one end of the first oblique section 182, which is integrally formed or split integrally with the first oblique section 182, the second transverse section 183 described in FIG. 3 extends laterally from the left end to the right end. In addition, in other embodiments of the present disclosure, the first lead 180 is not limited to including the above-described sections, and may include, for example, only the first oblique sections 182 and the like.

In the present embodiment, the second lead 190 includes a third transverse section 191, a second oblique section 192 and a fourth transverse section 193, one end of the third transverse section 191 is electrically connected to the second touch electrode 142, the other end of the third transverse section 191 is electrically connected to the second oblique section 192, the third transverse section 191 may be integrally molded or separately formed with the second touch electrode 142, the third transverse section 191 extends laterally from the end of the second touch electrode 142 in the direction of the second oblique section 192. The second oblique section 192 is electrically connected to the second transverse section 183 across the spacing between the printed circuit board 220 and the second touch electrode 142, specifically. The second oblique section 192 spans the spacing between the second touch electrode 142 and the first touch electrode 141, the spacing between the upper substrate 130 and the first touch electrode 141 and the spacing between the upper substrate 130 and printed circuit board 220. The second oblique section 192 is inclined, the inclination angle of the second oblique section 192 is 10° to 75°, for example, 10°, 20°, 30°, 40°, 45°, 50°, 60°, 70°, 75°, in FIG. 3, the second oblique section 192 extends from the upper left corner to the lower right corner, and the second oblique section 192 may be integrally molded or separately formed with the third transverse section 191. The fourth transverse section 193 is electrically connected to the printed circuit board 220 at the end away from the second oblique section 192, and the fourth transverse section 193 is integrally molded or separately formed with the second oblique section 192, the fourth transverse section 193 described in FIG. 3 extends laterally from the left end to the right end. In the present embodiment, the first lead wire 180 is electrically spaced from the second lead wire 190, and the first transverse section 181, the second transverse section 183, the third transverse section 191, and the fourth transverse section 193 are parallel, the second oblique section 192 is arranged in parallel with the first oblique section 182. In addition, in other embodiments of the present disclosure, the second lead is not limited to the above-mentioned segments, and may include, for example, only a second oblique segment or the like.

In the present embodiment, the first touch electrode 141 and the second touch electrode 142 are indium tin oxide (ITO) or other metal, the first lead 180 and the second lead 190 are metal wires, the first lead 180 is electrically connected to the first touch electrode 141, the second lead 190 is electrically connected to the second touch electrode 142. In addition, in other embodiments of the present disclosure, the first touch electrode and the second touch electrode are made of a flexible conductive material such as a metal mesh or a nanometer silver wire, the first touch electrode is integrally formed with the first lead, and the second touch electrode is integrally molded with the second lead electrode, thus, the first transverse portion of the first lead is located on the same layer as the first touch electrode. The third transverse portion of the second lead is located in the same layer as the second touch electrode, and there is no overlapping overlap between the lead and the touch electrode, thereby facilitating the reduction of the thickness of the touch screen and also facilitating the simplification of the process. In addition, in other embodiments of the present disclosure, the first touch electrode and the second touch electrode may also be made of other materials.

In the present embodiment, the number of the first touch electrodes 141 is plural, and the plurality of the first touch electrodes 141 may be distributed in the X-axis direction and electrically insulated from each other, the number of the first leads 180 is provided corresponding to the first touch electrode, and the plurality of the first leads 180 are electrically insulated from each other; the number of the second touch electrodes 142 is a plurality, the plurality of the second touches are distributed in the Y-axis direction and electrically insulated from each other, the number of the second leads 190 is set to the second touch electrode, and the plurality of the second leads 190 are electrically insulated from each other. In addition, in other embodiments of the present disclosure, the plurality of the first touch electrodes 141 may be distributed in the Y-axis direction, and a plurality of the second touches may be distributed along the X-axis direction.

In the present embodiment, please refer to FIG. 1 and FIG. 2, the display unit further includes an organic light emitting unit 120 sandwiched between the upper substrate 130 and the lower substrate 110, the organic light emitting unit 120 includes an anode 121, a cathode 123, and a light emitting layer 122 located between the anode 121 and the cathode 123, and the anode 121 or the cathode 123 electrically connects the output terminal of the thin film transistor. In another embodiment of the present disclosure, the display unit is a liquid crystal display unit, and the display unit further includes a pixel electrode, a liquid crystal layer, a common electrode, a color filter, and the like positioned between the upper substrate and the lower substrate, the pixel electrode is located on the upper substrate and electrically connects the output end of the thin film transistor, the liquid crystal layer is located between the pixel electrode and the common electrode, the color filter is located on the upper substrate facing away from the surface of the touch unit.

In addition, in the present embodiment, please refer to FIGS. 1 and 2, a touch insulating layer 144 is also provided between the first touch electrode 141 and the upper substrate 130, and a polarizer 150 is provided above the first touch electrode 141, the polarizer 150 is further provided with an over coating layer 160, and the polarizer 150 is provided with a cover lens 170.

In the present embodiment, the upper substrate 130, the lower substrate 110, the cover lens 170 may be a flexible substrate, or may be a rigid substrate, the transverse section may be horizontally transverse or approximately horizontally transverse.

In addition, in the present embodiment, the pitch between the first touch electrode 141 and the printed circuit board 220, the second touch, and the printed circuit board 220 is relatively large, thereby causing the span of the first oblique section 182 and second oblique section 192 is too large to break, and the second embodiment is described below to improve the problem.

The Second Embodiment

Figure 4:
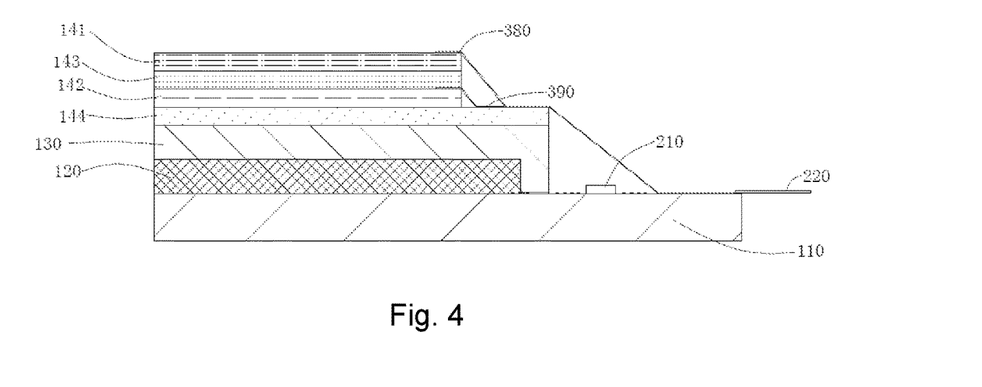
FIG. 4 is a cross-sectional view of the display unit and the touch unit according to the second embodiment of the present disclosure.

FIG. 4 is a touch display screen provided in the second embodiment of the present disclosure, the structure of FIG. 4 is similar to that of FIG. 2, so that the same element symbol represents the same element, and the main difference between the present embodiment and the first embodiment is the first lead and the second lead.

Figure 5:
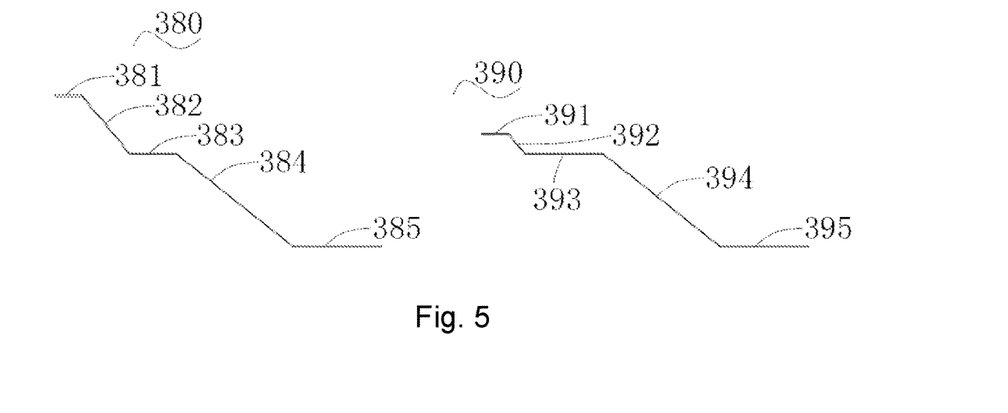
FIG. 5 is a cross-sectional view of the first lead and the second lead of the second embodiment of the present disclosure.

Please refer to FIG. 4 and FIG. 5, the first touch electrode 141 is electrically connected to the printed circuit board 220 through a first lead wire 380. In particular, the first lead wire 380 includes a fifth transverse section 381, a third oblique section 382, a sixth transverse section 383, a fourth oblique section 384, and a seventh transverse section 385, one end of the fifth transverse section 381 is electrically connected to the first touch electrode 141 and the other end of the fifth transverse section 381 is electrically connected to the third oblique section 382, the fifth transverse section 381 may be integrally formed or separately formed with the first touch electrode 141, and the fifth transverse section 381 extends laterally in the direction of the third oblique section 382 by the end of the first touch electrode 141. The third oblique section 382 is electrically connected to the sixth transverse section 383 across the spacing between the first and second touch electrodes 141 and 142, specifically, the thickness of the third oblique section 382 across the first touch electrode 141, the thickness of the intermediate insulating layer 143, the thickness of the second touch electrode 142, the third oblique section 382 is inclined, the inclination angle of the third oblique section 382 is 10° to 75°, for example, 10°, 20°, 30°, 40°, 45°, 50°, 60°, 70°, 75°, in FIG. 5, the third oblique section 382 extends obliquely from the upper left corner to the lower right corner, and the third oblique section 382 may be integrally molded or split separately from the fifth transverse section 381. The sixth transverse section 383 is electrically connected to the fourth oblique section 384 away from the third oblique section 382, which may be integrally formed or split integrally with the third oblique section 382, the sixth transverse section 383 extends laterally from the end of the third oblique section 382 in the direction of the fourth oblique section 384, which in the present embodiment is located on the touch insulating layer 144. The fourth oblique section 384 is electrically connected to the seventh transverse section 385 across the spacing between the printed circuit board 220 and the lower surface of the first touch electrode 141, specifically, the fourth oblique section 384 crosses the thickness of the touch insulating layer 144, the thickness of the upper substrate 130, the thickness of the organic light emitting unit 120, the fourth oblique section 384 is disposed obliquely, the inclination angle of the fourth oblique section 384 is 10° to 75°, for example, 10°, 20°, 30°, 40°, 45°, 50°, 60°, 70°, 75°, in FIG. 5, the fourth oblique section 384 extends obliquely from the upper left corner to the lower right corner, and the fourth oblique section 384 may be integrally formed or separately formed with the sixth transverse section 383, the fourth oblique section 384 may be parallel to or may not be parallel to the third oblique section 382. The seventh transverse section 385 is electrically connected to the printed circuit board 220 from one end of the fourth oblique section 384, which may be integrally formed or separately formed with the fourth oblique section 384, the seventh transverse section 385 extends laterally in the direction of the printed circuit board 220 by the end of the fourth oblique section 384. In addition, in other embodiments of the present disclosure, the first lead may further include more transverse and oblique segments.

The second touch electrode 142 is electrically connected to the printed circuit board 220 through a second lead wire 390. In particular, the second lead 390 includes an eighth transverse section 391, a fifth oblique section 392, a ninth transverse section 393, a sixth oblique section 394, and a tenth transverse section 395, one end of the eighth transverse section 391 is electrically connected to the second touch electrode 142, and the other end of the eighth transverse section 391 is electrically connected to the fifth oblique section 392, the eighth transverse section 391 may be integrally molded or separately formed with the second touch electrode 142, the eighth transverse section 391 extends laterally from the end of the second touch electrode 142 in the direction of the fifth oblique section 392. The fifth oblique section 392 is electrically connected to the ninth transverse section 393 across the thickness of the second touch electrode 142, the fifth oblique section 392 is provided obliquely, the inclination angle of the fifth oblique section 392 is 10° to 75°, for example, 10°, 20°, 30°, 40°, 45°, 50°, 60°, 70°, 75°, in FIG. 5, the fifth oblique section 392 extends obliquely from the upper left corner to the lower right corner, and the fifth oblique segment 392 may be integrally molded or separately formed with the eighth lateral segment 391. The ninth transverse section 393 is electrically connected to the sixth oblique section 394 at the end away from the fifth oblique section 392, which may be integrally formed or separately formed with the fifth oblique segment 392, the ninth transverse section 393 extends laterally from the end of the fifth oblique section 392 in the direction of the sixth oblique section 394, in the present embodiment, the ninth lateral section 393 is located on the touch insulating layer 144, that is, the ninth transverse section 393 and the sixth lateral section 383 are located in the same layer. The sixth oblique section 394 is electrically connected to the tenth transverse section 395 across the spacing between the printed circuit board 220 and the lower surface of the second touch electrode 142, specifically, the sixth oblique section 394 crosses the thickness of the touch insulating layer 144, the thickness of the upper substrate 130, the thickness of the organic light emitting unit 120, the sixth oblique section 394 is disposed obliquely, the inclination angle of the sixth oblique section 394 is 10° to 75°, for example, 10°, 20°, 30°, 40°, 45°, 50°, 60°, 70°, 75°, in FIG. 5, the sixth oblique section 394 extends from the upper left corner to the lower right corner, and the sixth oblique section 394 may be integrally molded or separately formed with the ninth transverse section 393, the sixth oblique section 394 may or may not be parallel to the fifth oblique section 392. The tenth transverse section 395 is electrically connected to the printed circuit board 220 at the end away from the sixth oblique section 394, which may be integrally formed or separately formed with the sixth oblique section 394, the tenth cross section 395 extends laterally in the direction of the printed circuit board 220 by the end of the sixth oblique segment 394. In addition, in other embodiments of the present disclosure, the second lead may further include more transverse and diagonal segments.

In the present embodiment, since the first lead wire 380 includes a third oblique section 382 and a fourth oblique section 384, the second lead 390 includes a fifth oblique section 392 and a sixth oblique section 394, thus, the span of the third oblique section 382 to the sixth oblique section 394 does not need to be too large, so that the first lead wire 380 and the second lead wire 390 are not easily broken, thereby improving the yield of the product, thereby reducing the cost.

It should be noted that the various embodiments in the present specification are described in a progressive manner, each of which focuses on the differences from the other embodiments, the same similar parts between the various embodiments may be referred to each other. For the device embodiment, since it is substantially similar to the method embodiment, the description is relatively simple and the relevant part is described in part of the method embodiment.

The present disclosure has the following advantages by the description of the above embodiments:

Since the thin film transistor is electrically connected to a driving circuit, the driving circuit is electrically connected to the printed circuit board, the first touch electrode is connected to the printed circuit board through a first lead wire, the second touch electrode is connected to the printed circuit board through a second lead, so that it is not necessary to provide two printed circuit boards due to the thin film transistor, the first touch electrode, and the second touch electrode with respect to the prior art, so that the cost can be saved, and the process is also relatively simple to the prior art.

It is intended that the equivalents of the claims of the present disclosure be limited to the scope of the present disclosure without departing from the scope of the disclosure as defined by the preferred embodiments of the present disclosure.

What is claimed is:

1. A touch display screen, comprising:
a display unit comprising:
an upper substrate;
a lower substrate located below the upper substrate and opposed to the upper substrate, the lower substrate arranged with a plurality of thin film transistors, a driving circuit and a printed circuit board, the plurality of the thin film transistors electrically connected to the driving circuit, the driving circuit electrically connected to the printed circuit board;
a touch unit located on the upper substrate, comprising:
a first touch electrode located on the upper substrate, the first touch electrode electrically connected to the printed circuit board through a first lead;
a second touch electrode electrically insulated from the first touch electrode, the second touch electrode electrically connected to the printed circuit board through a second lead;
wherein, the first lead is electrically connected to the printed circuit board across a distance between the printed circuit board and the first touch electrode, the second lead is electrically connected to the printed circuit board across a distance between the printed circuit board and the second touch electrode; and
wherein, the second lead comprises a third transverse section, a second oblique section and a fourth transverse section, one end of the third transverse section is electrically connected to the second touch electrode, the other end of the third transverse section is electrically connected to the second oblique section, the second oblique section is electrically connected to the fourth transverse section across a distance between the printed circuit board and the second touch electrode, the fourth transverse section is electrically connected to the printed circuit board at the end away from the second oblique section.

2. The touch display screen according to claim 1, wherein, the first lead comprises a first transverse section, a first oblique section and a second transverse section, one end of the first transverse section is electrically connected to the first touch electrode, the other end of the first transverse section is electrically connected to the first oblique section, the first oblique section is electrically connected to the second transverse section across a distance between the printed circuit board and the first touch electrode, the second transverse section is electrically connected to the printed circuit board at the end away from the first oblique section.

3. The touch display screen according to any one of claim 2, wherein, the first touch electrode and the second touch electrode are made of a flexible conductive material resistant to winding, the first touch electrode is integrally formed with the first lead, and the second touch electrode is integrally molded with the second lead.

4. The touch display screen according to claim 2, wherein, the printed circuit board is a flexible printed circuit board.

5. The touch display screen according to any one of claim 2, wherein, the first touch electrode and the second touch electrode are made of indium tin oxide, the first lead is electrically connected to the first touch electrode, and the second lead is electrically connected to the second touch electrode.

6. The touch display screen according to claim 1, wherein, the first lead comprises a fifth transverse section, a third oblique section, a sixth transverse section, a fourth oblique section and a seventh transverse section, one end of the fifth transverse section is electrically connected to the first touch electrode, the other end of the fifth transverse section is electrically connected to the third oblique section, the third oblique section is electrically connected to the sixth transverse section across a distance between the first touch electrode and the second touch electrode, the sixth transverse section is electrically connected to the fourth oblique section at the end away from the third oblique section, the fourth oblique section is electrically connected to the seventh transverse section across a distance between the printed circuit board and the first touch electrode, the seventh transverse section is electrically connected to the printed circuit board at the end away from the fourth oblique section.

7. The touch display screen according to any one of claim 6, wherein, the first touch electrode and the second touch electrode are made of a flexible conductive material resistant to winding, the first touch electrode is integrally formed with the first lead, and the second touch electrode is integrally molded with the second lead.

8. The touch display screen according to claim 6, wherein, the printed circuit board is a flexible printed circuit board.

9. The touch display screen according to claim 1, wherein, the second lead comprises an eighth transverse section, a fifth oblique section, a ninth transverse section, a sixth oblique section and a tenth transverse section, one end of the eighth transverse section is electrically connected to the second touch electrode, the other end of the eighth transverse section is electrically connected to the fifth oblique section, the fifth oblique section is electrically connected to the ninth transverse section across the thickness of the second touch electrode, the ninth transverse section is electrically connected to the sixth oblique section at the end away from the fifth oblique section, the sixth oblique section is electrically connected to the tenth transverse section across a distance between the printed circuit board and the first touch electrode, the tenth transverse section is electrically connected to the printed circuit board at the end away from the sixth oblique section.

10. The touch display screen according to any one of claim 9, wherein, the first touch electrode and the second touch electrode are made of a flexible conductive material resistant to winding, the first touch electrode is integrally formed with the first lead, and the second touch electrode is integrally molded with the second lead.

11. The touch display screen according to claim 9, wherein, the printed circuit board is a flexible printed circuit board.

12. The touch display screen according to claim 1, wherein, the first touch electrode and the second touch electrode are made of a flexible conductive material resistant to winding, the first touch electrode is integrally formed with the first lead, and the second touch electrode is integrally molded with the second lead.

13. The touch display screen according to claim 1, wherein, the first touch electrode and the second touch electrode are made of indium tin oxide, the first lead is electrically connected to the first touch electrode, and the second lead is electrically connected to the second touch electrode.

14. The touch display screen according to claim 1, wherein, the display unit further comprises an organic light emitting unit located between the upper substrate and the lower substrate, the upper substrate is a thin film encapsulation layer.

15. The touch display screen according to claim 1, wherein, a liquid crystal layer is provided between the upper substrate and the lower substrate, and the upper substrate is arranged with a color filter facing away from surface of the touch unit.

16. The touch display screen according to claim 1, wherein, the printed circuit board is a flexible printed circuit board.

17. The touch display screen according to any one of claim 1, wherein, the first touch electrode and the second touch electrode are made of a flexible conductive material resistant to winding, the first touch electrode is integrally formed with the first lead, and the second touch electrode is integrally molded with the second lead.

18. The touch display screen according to claim 1, wherein, the printed circuit board is a flexible printed circuit board.

19. The touch display screen according to any one of claim 1, wherein, the first touch electrode and the second touch electrode are made of indium tin oxide, the first lead is electrically connected to the first touch electrode, and the second lead is electrically connected to the second touch electrode.

* * * * *